US007059045B2

(12) United States Patent
Lu et al.

(10) Patent No.: US 7,059,045 B2
(45) Date of Patent: Jun. 13, 2006

(54) METHOD FOR HANDLING INTEGRATED CIRCUIT DIE

(75) Inventors: Daoqiang Lu, Chandler, AZ (US); Christopher L. Rumer, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 175 days.

(21) Appl. No.: 10/728,329

(22) Filed: Dec. 4, 2003

(65) Prior Publication Data

US 2005/0120551 A1 Jun. 9, 2005

(51) Int. Cl.
*H05K 3/34* (2006.01)

(52) U.S. Cl. ........................... 29/840; 29/832; 29/739; 29/740; 29/743; 29/759; 29/760; 29/DIG. 44; 294/64.1; 324/765

(58) Field of Classification Search ................. 29/739, 29/740, 743, 832, 840, 759, 760, DIG. 44; 156/230, 247, 285; 324/760, 765, 158.1; 414/804–806, 810, 752.1; 228/212, 213, 228/49.1, 49.5; 24/457, 458; 294/64.1
See application file for complete search history.

(56) References Cited

U.S. PATENT DOCUMENTS 5,317,803 A * 6/1994 Spigarelli et al. ............. 29/840
5,519,332 A * 5/1996 Wood et al. ................ 324/755
5,722,159 A * 3/1998 Stratas ........................ 29/832
5,739,050 A * 4/1998 Farnworth ................... 438/15
6,407,006 B1 * 6/2002 Levert et al. ............... 438/761
6,504,723 B1 * 1/2003 Fitzgerald et al. .......... 361/705
6,629,363 B1 * 10/2003 Chan ........................... 29/832

FOREIGN PATENT DOCUMENTS

JP 05040149 A * 2/1993 ............. 324/158.1

OTHER PUBLICATIONS

Online Dictionary "www.encarta.com" for Definition of "Plastic".*

* cited by examiner

*Primary Examiner*—George Nguyen
*Assistant Examiner*—Sarang Afzali
(74) *Attorney, Agent, or Firm*—Buckley, Maschoff & Talwalkar LLC

(57) ABSTRACT

In some embodiments, a method includes picking up a clip with a chuck, and, while holding the clip with the chuck, picking up an integrated circuit (IC) die with the IC die in contact with the clip.

13 Claims, 6 Drawing Sheets

200 204 204 300 304 502 400 304 500 600 602 602
200 300 500 600 502 400 304 304

METHOD FOR HANDLING INTEGRATED CIRCUIT DIE

BACKGROUND

Integrated circuit (IC) dies are small and easily subject to damage if mishandled. A process in which an IC die is to be attached to another object requires careful, precise and repeatable handling.

DETAILED DESCRIPTION

Figure 1:
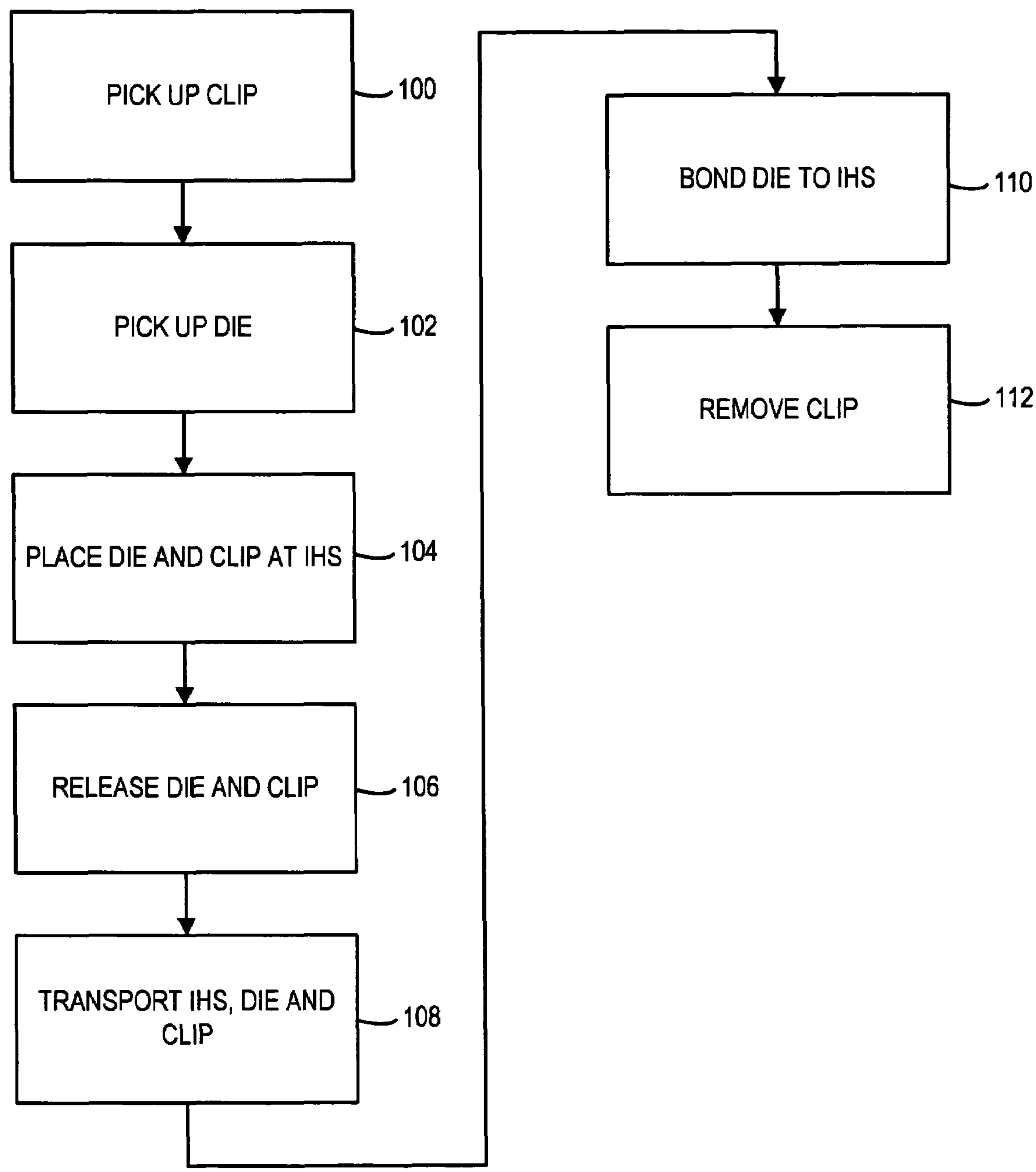
FIG. 1 is a flow chart that illustrates a process according to some embodiments for bonding an IC die to a heat spreader.

FIG. 1 is a flow chart that illustrates a process according to some embodiments for bonding an IC die to a heat spreader.

Figure 2:
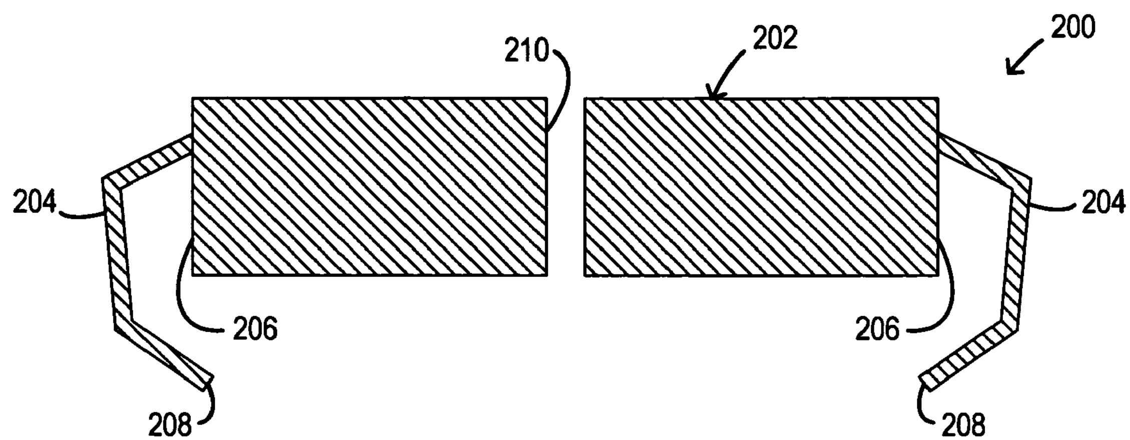
FIG. 2 is a schematic vertical cross-sectional view of a workpiece-handling chuck that may be used in the process of FIG. 1.

At 100 in FIG. 1, a clip is picked up with a workpiece handling chuck of a pick and place machine. FIG. 2 is a schematic vertical cross-sectional view of a chuck 200 that may be used according to some embodiments. (A pick and place machine to which the chuck 200 may be attached is not shown but may generally be provided in accordance with conventional practices.) The chuck 200 may include a main section 202. Fingers 204 extend downwardly from sides 206 of the main section 202. The fingers 204 have tips 208. The fingers 204 may be movable so that the gap between the tips 208 may be increased or reduced. An arrangement for moving the fingers 204 is not shown but may be provided in accordance with conventional practices.

A vacuum aperture 210 is formed vertically through the main section 202 of the chuck 200 at a central location relative to the main section 202. The vacuum aperture 210 may, but need not, be circular in horizontal cross-section (the horizontal cross section of the aperture 210 is not shown).

The chuck 200 may be provided in accordance with conventional practices, but with the addition of the vacuum capability.

Figure 3:
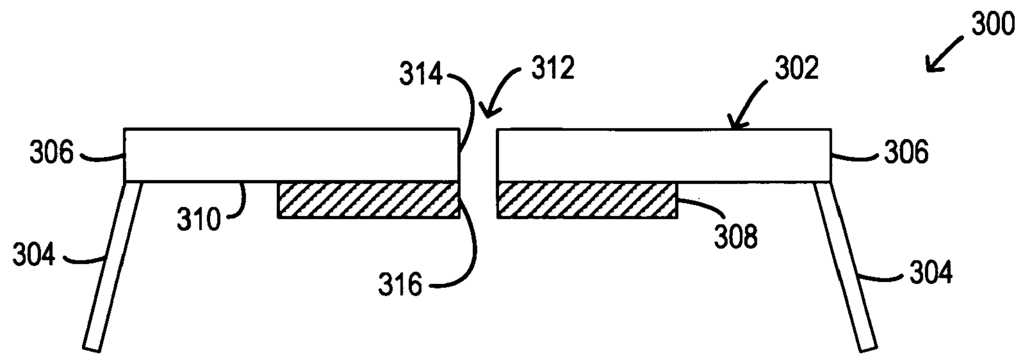
FIG. 3 is a schematic vertical cross-sectional view of a clip that may be used to secure the IC die during the process of FIG. 1.
Figure 4:
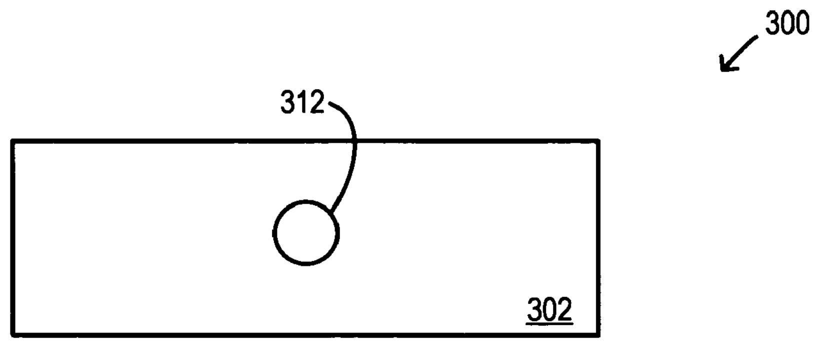
FIG. 4 is a simplified schematic plan view of the clip of FIG. 3.

FIG. 3 is a schematic vertical cross-sectional view of a clip 300 that may be picked up by the chuck 200 in accordance with some embodiments. FIG. 4 is a simplified plan view of the clip 300.

The clip 300 includes a main body 302 which may take the form of a generally planar rectangular prism. The clip 300 also includes legs 304 which extend downwardly and somewhat outwardly from opposed ends 306 of the main body 302 of the clip 300. (To simplify the drawing, the legs 304 are not shown in FIG. 4.) The clip 300 further includes a pad 308 mounted on an underside 310 of the main body 302. The pad 308 may be formed of a relatively soft and heat-resistant material. For example, the pad 308 may be formed of a suitable polymer such as silicone, polyimide or fluoropolymer sponge (e.g., a polytetrafluoroethylene (PTFE) sponge). The pad 308 may be somewhat smaller in horizontal extent than the main body 302. The main body 302 and legs 304 of the clip 300 may be formed integrally of a suitable metal having a degree of resilience, such as stainless steel, iron alloy, copper alloy or aluminum.

A vacuum aperture 312 is formed vertically through the main body 302 and the pad 308 of the clip 300 at a central location relative to the main body 302. That is, the vacuum aperture 312 is formed of a sub-aperture 314 formed vertically through the main body 302 and of a sub-aperture 316 formed vertically through the pad 308, with the sub-apertures 314, 316 being vertically aligned with each other. The vacuum aperture 312 may, but need not, have a circular horizontal cross-section, as shown in FIG. 4. The horizontal cross-sectional area of the vacuum aperture 312 may be substantially the same as the horizontal cross-sectional area of the vacuum aperture 210 of the chuck 200. For example, the diameter of the vacuum aperture 312 may be substantially the same as the diameter of the vacuum aperture 210.

Figure 5:
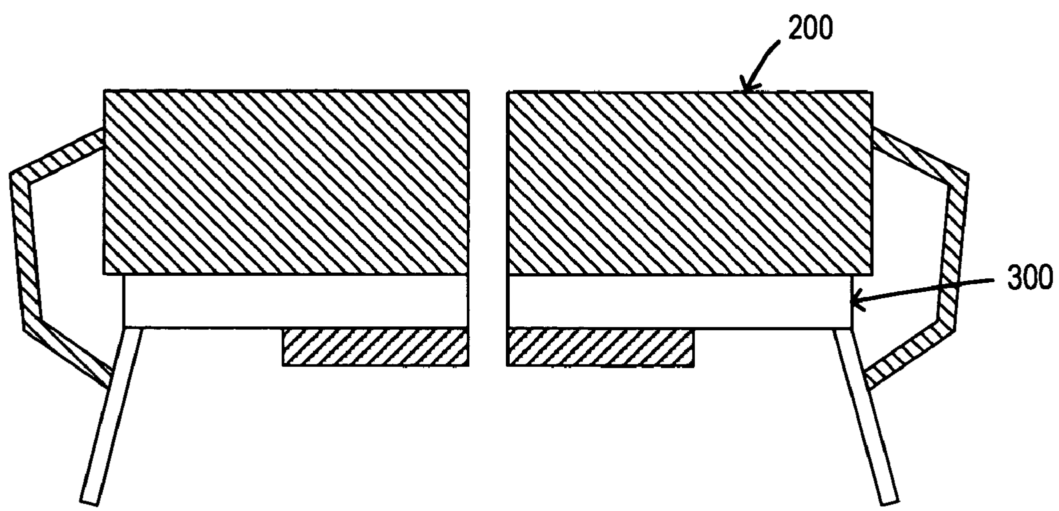
FIG. 5 is a view similar to FIGS. 2 and 3 showing the clip of FIGS. 3 and 4 held by the chuck of FIG. 2 at an early stage of the process of FIG. 1.

The picking up of the clip 300 by the chuck 200 may be performed by bringing the lower surface of the main section 202 of the chuck 200 into contact with the upper surface of the main body 302 of the clip 300, with the vacuum aperture 210 of the chuck 200 in vertical alignment with the vacuum aperture 312 of the clip 300. The tips 208 of the fingers 204 of the chuck 200 may be moved toward each other so that each tip 208 engages a leg 304 of the clip 300. In this way the chuck 200 may grip the clip 300. The chuck 200 may then be raised to pick up the clip 300. FIG. 5 shows the chuck 200 holding the clip 300 after picking up the clip 300.

Figure 6:
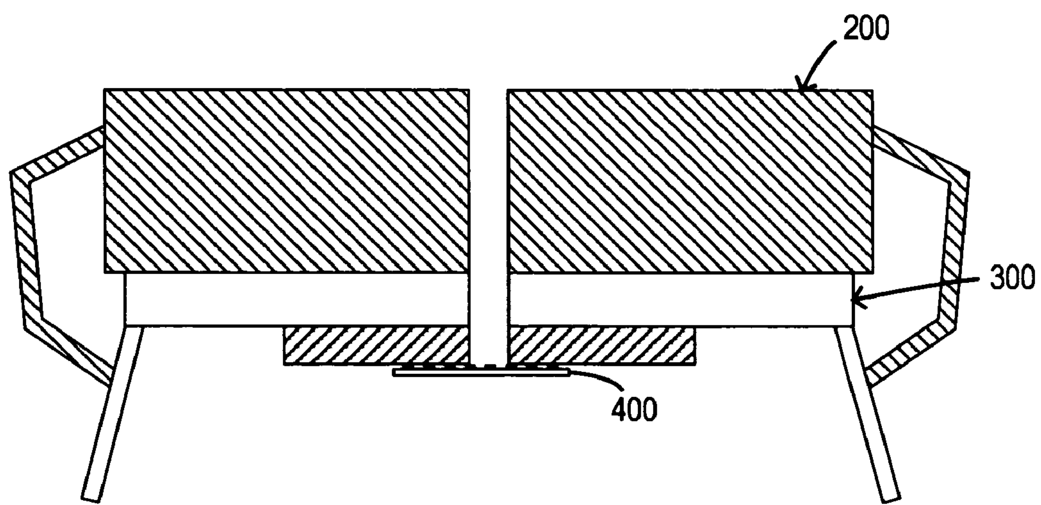
FIG. 6 is a view similar to FIG. 5 showing the IC die held by the chuck and the clip at a subsequent stage of the process of FIG. 1.

Next, at 102 in FIG. 1, the chuck 200 is operated to pick up an IC die 400 (FIG. 6) while the chuck 200 holds the clip 300. (Before the IC die 400 is picked up, it may be resting on a pedestal, which is not shown. The pedestal may be provided to avoid interference with the fingers 204 of the chuck 200 and with the legs 304 of the clip 300.) This operation may include bringing the pad 308 of the clip 300 into contact with the face of the IC die 400 and then applying vacuum to the face of the IC die 400 via the vacuum aperture 210 of the chuck 200 and via the vacuum aperture 312 of the clip 300. With the vacuum thus applied to the IC die 400, the IC die is in effect held by the chuck 200 with the clip 300 interposed between the IC die and the chuck, as shown in FIG. 6. The IC die may then be picked up by raising the chuck. FIG. 6 may also be considered to show the IC die after being picked up and while being held by the chuck.

The pad 308 that is part of the clip 300 may aid in preventing damage to bumps on the face of the IC die 400 while the IC die 400 is engaged by the clip 300 and the chuck 200.

In some embodiments, the IC die 400 may be of the type sometimes referred to as a "thinned die", i.e., a die having a thickness on the order of 50 to 100 micrometers.

Figure 7:
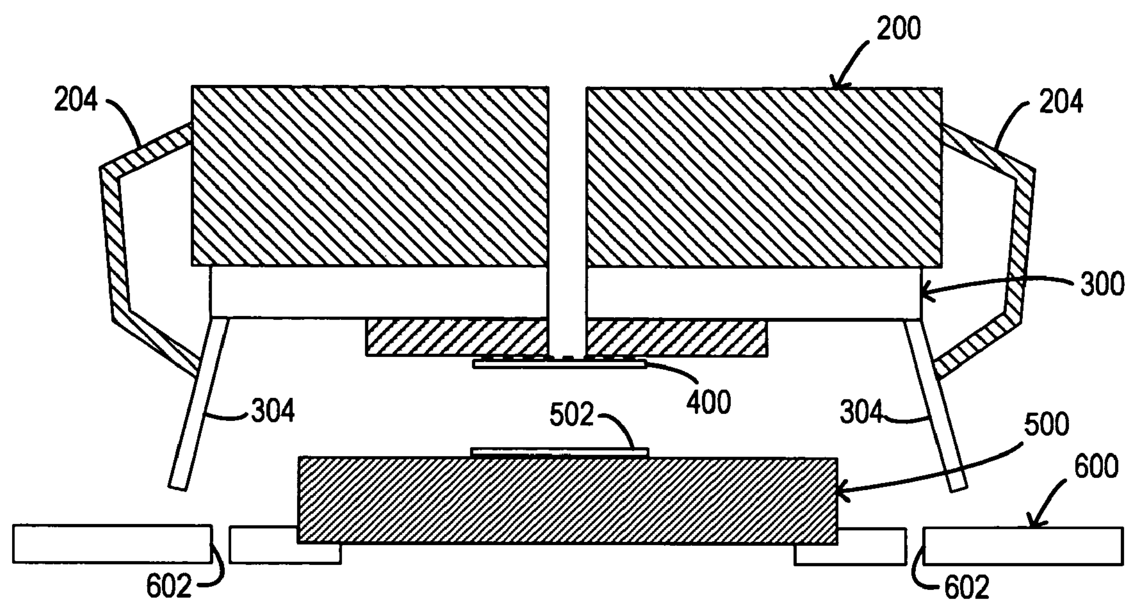
FIG. 7 is a view similar to FIGS. 5 and 6 showing the IC die held by the chuck and the clip in alignment with the heat spreader at a subsequent stage of the process of FIG. 1.

In the next operation, indicated at 104 in FIG. 1, the chuck is used to simultaneously place the clip and IC die into juxtaposition with a heat spreader 500 (FIGS. 7 and 8) to which the IC die is to be bonded. (The IC die should be considered to be "in juxtaposition with" the heat spreader when positioned near or in contact with the heat spreader, and the clip should be considered to be "in juxtaposition with" the heat spreader when in position to hold the die in juxtaposition with the heat spreader.) The heat spreader 500 may be, for example, of the type commonly referred to as an integrated heat spreader (IHS). The heat spreader 500 may include a solder layer 502, that is present for the purpose of bonding the IC die 400 to the heat spreader 500. The solder layer 502 may comprise, for example, a gold/tin solder layer. The heat spreader 500 may be supported on a carrier 600.

The placement of the clip and the IC die into juxtaposition with the heat spreader may be considered to include a number of stages, including a first stage (illustrated in FIG. 7) in which the chuck 200 is moved so as to vertically align the IC die 400 with the solder layer 502. Then the fingers 204 of the chuck 200 may be moved toward each other to move the legs 304 of the clip 300 from the splayed position shown in FIG. 7 to a substantially vertical position. Next the chuck 200 may be moved downwardly to put the back of the IC die 400 in contact with the solder layer 502 of the heat spreader 500 (see FIG. 8) while simultaneously inserting the legs 304 of the clip 300 into slots 602 (best seen in FIG. 7) of the carrier 600.

Figure 8:
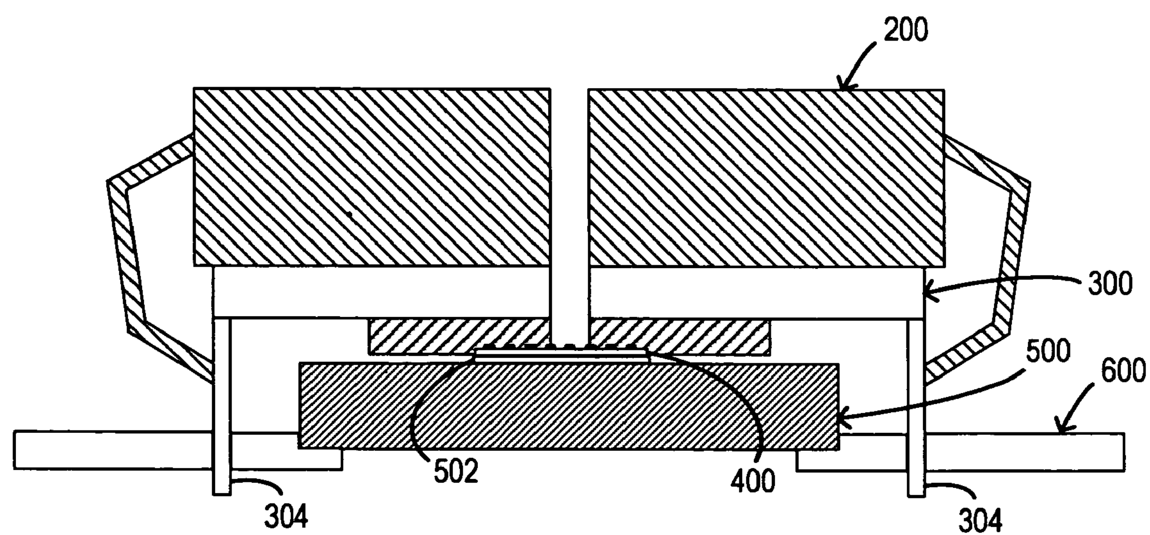
FIG. 8 is a view similar to FIG. 7 showing the chuck simultaneously placing the IC die and the clip in juxtaposition with the heat spreader at a subsequent stage of the process of FIG. 1.
Figure 9:
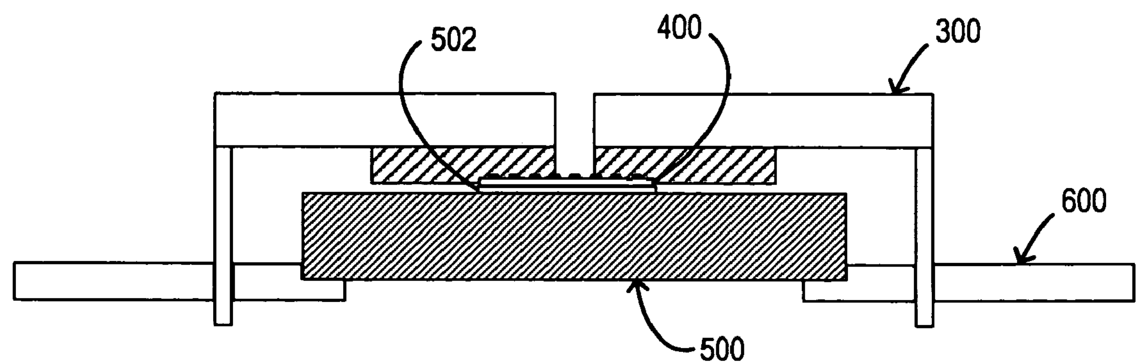
FIG. 9 is a view similar to FIG. 8 showing the clip holding the IC die in position on the heat spreader at a subsequent stage of the process of FIG. 1 after the clip and IC die have been released by the chuck.

At this point, as seen from FIG. 8, the clip 300 is secured to the carrier 600, and the IC die 400 is secured to the heat spreader 500 by the clip 300. The chuck 200 may now be operated to release the clip 300 and the IC die 400 from the chuck 200, as indicated at 106 in FIG. 1. More specifically, the vacuum may be deactuated and the fingers 204 of the chuck 200 may be moved away from each other so that the fingers 204 no longer engage the legs 304 of the clip 300. The chuck may then be moved upwardly and/or horizontally away from the heat spreader 500, leaving the IC die 400 held in place on the heat spreader 500 by the clip 300, as illustrated in FIG. 9.

Next, as indicated at 108 in FIG. 1, the carrier 600 may be moved so as to transport the heat spreader 500, together with the die 400 and the clip 300, away from the pick and place machine and to another location at which the bonding of the IC die to the heat spreader may occur. For example, the carrier 600 with the heat spreader 500, the die 400 and the clip 300 may be transported to a reflow oven at which the solder layer 502 of the heat spreader 500 may be heated to a sufficient extent to reflow the solder layer to bond the die 400 to the heat spreader 500. (The bonding operation is indicated at 110 in FIG. 1, and may occur with the die held in place on the heat spreader with the clip.) It should be noted that the clip holds the die in place during the transporting operation 108 so as to reduce or eliminate the possibility of movement of the die relative to the heat spreader during transportation. This may improve the reliability and repeatability of the process of bonding the die to the heat spreader. Also, the entire process may be efficiently performed, since placement of the clip and the die relative to the heat spreader may be performed simultaneously, with a single chuck on a single pick and place machine.

Figure 10:
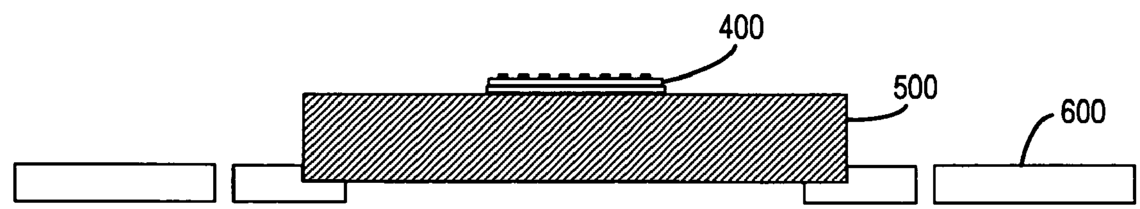
FIG. 10 is a view similar to FIG. 9, showing the IC die bonded to the heat spreader at a subsequent stage of the process of FIG. 1 after the clip has been removed from juxtaposition with the heat spreader.

Once the die has been bonded to the heat spreader, the clip may be removed (as indicated at 112 in FIG. 1) from the carrier 600 and from the vicinity of the heat spreader 500 and the die 400. The heat spreader 500, with the die 400 bonded thereto, are shown in FIG. 10 after removal of the clip. Further processing of the die and the heat spreader, including transporting the die and heat spreader to other locations, may now take place.

The process described above may be suitable for use as part of a high volume microelectronics manufacturing process. In connection with such a process, heat spreaders may be taken into a pick and place machine on carriers, clips may be taken into the pick and place machine on a tray, dies may come in to the pick and place machine on a tape and reel arrangement, and a heat spreader, clip and die together exit the pick and place machine on the carrier.

Figure 11:
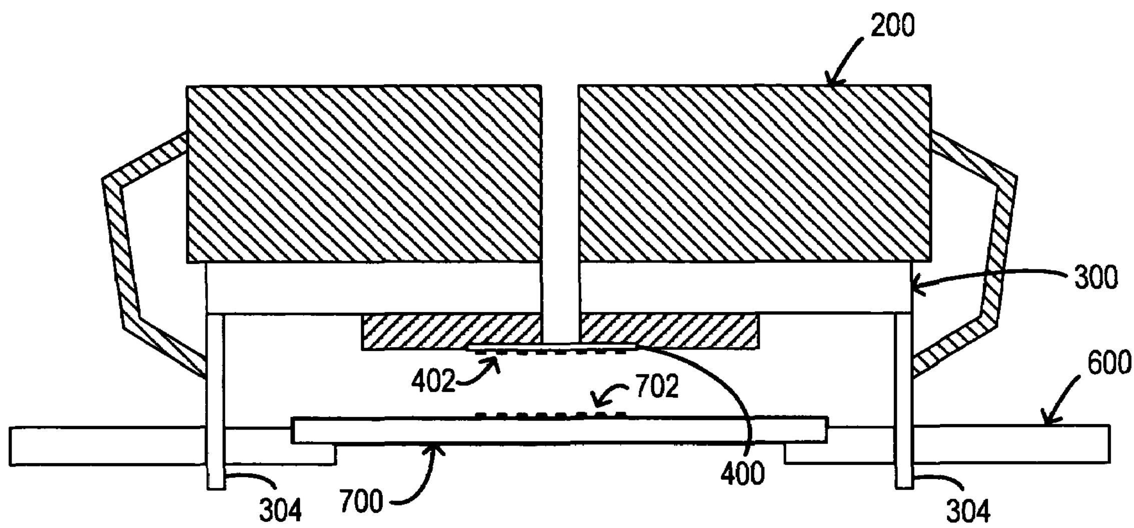
FIG. 11 is a schematic side cross-sectional view that illustrates a stage of a process in accordance with another embodiment in which the chuck is employed to place a clip and IC die in position on a package substrate.

The process described above in connection with FIGS. 1–10 may be modified, in some embodiments, to bond an IC die 400 to a package substrate 700 (FIG. 11) instead of the heat spreader 500 shown in FIGS. 7 and 8. FIG. 11 illustrates one stage of the modified process. As seen from FIG. 11, the IC die 400 is held by the chuck 200 and the clip 300 with connection (e.g., copper or solder) bumps 402 facing down, rather than facing up as in the process of FIGS. 1–10. In the modified process, the connection bumps 402 of the IC die 400 are aligned with solder bumps 702 of the package substrate 700. The clip 300 and the IC die 400 are placed in juxtaposition with the package substrate 700 by the chuck 200. The chuck 200 then releases the clip 300 and the IC die 400, with the IC die 400 held in place on the package substrate 700 by the clip 300. Then the substrate package 700, the IC die 400 and the clip 300 are transported to an oven (not shown), at which the IC die 400 is bonded to the package substrate 700 (i.e., bumps 402 of the IC die 400 are bonded to bumps 702 of the package substrate 700), with the IC die 400 held in place on the package substrate 700 by the clip 300 during the transporting and bonding. The clip 300 is then removed from the IC die 400 and from the package substrate 700.

The processes described above may be more effective, have higher throughput, and be less likely to result in thermal or mechanical damage to the IC die, than a thermocompression bonding process. Moreover, by simultaneously placing the die and clip, there may be no opportunity for the die to experience movement prior to placement of the clip, as may occur were the placement of die and clip to be carried out in separate operations in separate pick and place machines.

Another advantage of the process described above is that it may be suitable for use with IC dies of various sizes and/or thicknesses.

Thus, in some embodiments, a method may include picking up a clip with a chuck, and, while holding the clip with the chuck, picking up an integrated circuit (IC) die with the IC die in contact with the clip.

Also, in some embodiments, a method may include holding a clip in a chuck such that an aperture in the clip is aligned with an aperture in the chuck, and picking up an IC die by applying a vacuum to the IC die via the apertures in the clip and in the chuck.

In some embodiments, a clip may include a main body, a plurality of legs extending downwardly from the main body, and a polymer pad mounted on an underside of the main body.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:

picking up a clip with a chuck;

while holding the clip with the chuck, picking up an integrated circuit (IC) die with the IC die in direct contact with the clip; and using the chuck to simultaneously place the clip and the IC die into juxtaposition with a heat spreader;

wherein the placing of the clip into juxtaposition with the heat spreader includes using the chuck to move legs of the clip towards each other from a splayed position to a substantially vertical position.

2. The method of claim 1, further comprising:

releasing the clip and the IC die from the chuck while holding the IC die in place on the heat spreader with the clip.

3. The method of claim 2, further comprising:

bonding the IC die to the heat spreader while holding the IC die in place on the heat spreader with the clip.

4. The method of claim 3, further comprising:

after bonding the IC die to the heat spreader, removing the clip from the IC die and from the heat spreader.

5. The method of claim 3, further comprising:

before bonding the IC die to the heat spreader, transporting the heat spreader with the IC die held in place on the heat spreader by the clip.

6. The method of claim 5, wherein the transporting of the heat spreader with the IC die held thereon by the clip is performed after the releasing of the clip and the IC die from the chuck.

7. The method of claim 3, wherein the bonding includes reflowing a solder layer on the heat spreader.

8. The method of claim 1, wherein the picking up of the IC die includes applying a vacuum to the IC die.

9. The method of claim 8, wherein the vacuum is applied to the IC die via an aperture in the clip.

10. The method of claim 9, wherein the IC die is in contact with a polymer pad that is part of the clip.

11. A method comprising:

holding a clip in a chuck such that an aperture in the clip is aligned with an aperture in the chuck;

picking up an integrated circuit (IC) die by applying a vacuum to the IC die via the apertures in the clip and in the chuck;

using the chuck to simultaneously place the clip and the IC die into juxtaposition with a heat spreader;

releasing the clip and the IC die from the chuck while holding the IC die in place on the heat spreader with the clip; and soldering the IC die to the heat spreader while holding the IC die in place on the heat spreader with the clip;

wherein the placing of the clip into juxtaposition with the heat spreader includes using the chuck to move legs of the clip towards each other from a splayed position to a substantially vertical position.

12. The method of claim 11, further comprising:

after soldering the IC die to the heat spreader, removing the clip from the IC die and from the heat spreader.

13. The method of claim 11, wherein the IC die is held by the chuck with the clip interposed between the IC die and the chuck.

* * * * *